United States Patent

Chung

(10) Patent No.: US 9,466,349 B1
(45) Date of Patent: Oct. 11, 2016

(54) SEMICONDUCTOR SYSTEM WITH TRAINING FUNCTION FOR A DATA STROBE SIGNAL

(71) Applicant: SK hynix Inc., Icheon-si Gyeonggi-do (KR)

(72) Inventor: Won Kyung Chung, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/885,564

(22) Filed: Oct. 16, 2015

(30) Foreign Application Priority Data

Jun. 15, 2015 (KR) .................. 10-2015-0084341

(51) Int. Cl.
*G11C 8/18* (2006.01)
*H03K 5/131* (2014.01)
*H03K 5/13* (2014.01)

(52) U.S. Cl.
CPC ............. *G11C 8/18* (2013.01); *H03K 5/131* (2013.01)

(58) Field of Classification Search
CPC ........... G11C 8/18; H03K 5/13; H03K 5/131
USPC ........ 327/261, 262, 276, 291, 292; 365/193, 365/194
See application file for complete search history.

(56) References Cited

U.S. PATENT DOCUMENTS

| | | | | |
|---|---|---|---|---|
| 7,457,175 B1* | 11/2008 | Griffith | ............... | G06F 13/1689 365/193 |
| 7,793,063 B1* | 9/2010 | White | .................. | G11C 29/028 365/189.07 |
| 2009/0006776 A1* | 1/2009 | Spry | .................. | G06F 13/1689 711/154 |
| 2009/0244997 A1* | 10/2009 | Searles | ............... | G11C 7/1051 365/194 |
| 2012/0163101 A1* | 6/2012 | Kato | ....................... | G11C 7/02 365/189.06 |
| 2012/0250434 A1* | 10/2012 | Song | .................... | G11C 7/1093 365/193 |
| 2013/0315014 A1 | 11/2013 | Dearth et al. | | |
| 2015/0221354 A1* | 8/2015 | Palmer | ..................... | G11C 7/22 365/193 |

FOREIGN PATENT DOCUMENTS

KR      1020140037443 A      3/2014

* cited by examiner

*Primary Examiner* — William Hernandez
(74) *Attorney, Agent, or Firm* — William Park & Associates Ltd.

(57) ABSTRACT

A semiconductor system includes a controller and a semiconductor device. The controller generates a clock signal and updates external count signals in response to an external update signal. The semiconductor device generates count signals by counting pulses of a strobe signal during a period when a section signal is in an active state. The section signal is generated in response to a first control signal including pulses that are periodically generated. The semiconductor device also generates the external update signal and the external count signals if a combination of the count signals is changed.

19 Claims, 7 Drawing Sheets

US 9,466,349 B1

SEMICONDUCTOR SYSTEM WITH TRAINING FUNCTION FOR A DATA STROBE SIGNAL

CROSS-REFERENCE TO RELATED APPLICATIONS

The present application claims priority under 35 U.S.C 119(a) to Korean Application No. 10-2015-0084341 filed on Jun. 15, 2015, in the Korean Intellectual Property Office, which is incorporated herein by reference in its entirety.

BACKGROUND

1. Technical Field

Embodiments of the present disclosure generally relate to an integrated circuit, and more particularly to a semiconductor system.

2. Related Art

With broadening uses of high-performance mobile devices, the efforts to highly integrate the semiconductor devices and increase their speed of operation continue. In order to increase their speed of operation, synchronous semiconductor devices have an interface that is synchronized with the system bus.

Data strobe signal is a signal that is used to transmit data in synchronous semiconductor devices. Data strobe signal is transmitted with data, to be used in capturing data at the receiver. For instance, double data rate synchronous DRAM uses DQS signal as a data strobe signal. When a data strobe signal is used in a synchronous semiconductor device, however, an amount of delay occurred on the data strobe signal may vary due to in process/voltage/temperature (hereinafter referred to as "PVT") variation. The delay variation in the data strobe signal may cause errors in capturing data at the receiver.

Since requirements for the data strobe signal, which is defined in a specification for the synchronous semiconductor device, are determined on the basis of a clock signal CLK, it may be difficult to meet the requirements as a frequency of the clock signal CLK being used in the semiconductor devices increases.

Thus, a training function for the strobe signal DQS may be provided to compensate for a delay amount of the strobe signal DQS according to the specification.

SUMMARY

Various embodiments are directed to semiconductor systems.

According to an embodiment, a semiconductor system includes a controller and a semiconductor device. The controller is suitable for generating a clock signal and suitable for updating external count signals in response to an external update signal. The semiconductor device is suitable for generating count signals by counting pulses of a strobe signal during an enablement section of a section signal which is generated in response to a first control signal including pulses that are periodically generated and suitable for generating the external update signal and the external count signals if a combination of the count signals is changed.

According to another embodiment, a semiconductor system includes a controller and a semiconductor device. The controller is suitable for generating a clock signal and a strobe signal, suitable for updating external count signals in response to an external update signal, and suitable for adjusting occurrence points of time of pulses of the strobe signal in response to the external count signals. The semiconductor device is suitable for generating count signals by counting pulses of the strobe signal during an enablement section of a section signal which is generated in response to a first control signal including pulses that are periodically generated and suitable for generating the external update signal and the external count signals if a combination of the count signals is changed.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
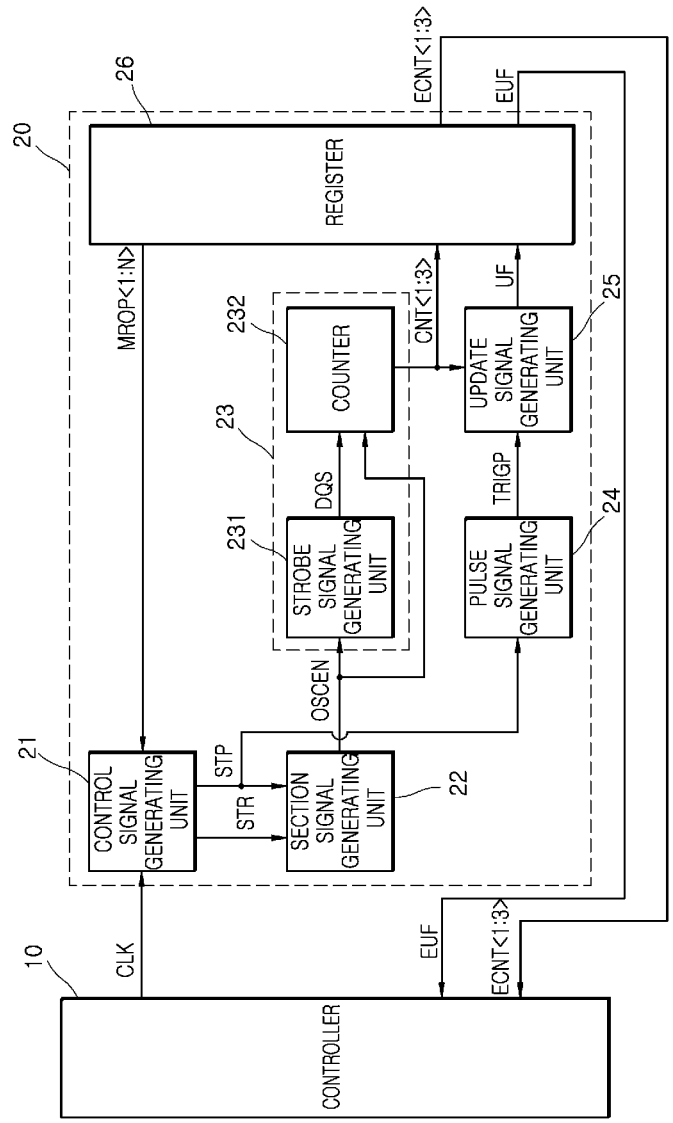
FIG. 1 is a block diagram illustrating a configuration of a semiconductor system according to an embodiment.

As illustrated in FIG. 1, a semiconductor system according to an embodiment may include a controller 10 and a semiconductor device 20. The semiconductor device 20 may include a control signal generating unit 21, a section signal generating unit 22, a pulse sensing unit 23, a pulse signal generating unit 24, an update signal generating unit 25, and a register 26.

The controller 10 may generate a clock signal CLK and may update first to third external count signals ECNT<1:3> in response to an external update signal EUF.

The control signal generating unit 21 may generate first and second control signals STR and STP, each of which includes pulses. The first control signal STR may include pulses periodically generated after a power-up period. The points in time, at which the pulses of the second control signal STP are generated, may be adjusted according to a combination of first to $N^{th}$ mode set signals MROP<1:N>.

The section signal generating unit 22 may generate a section signal OSCEN which becomes is active from a point in time when the first control signal STR is inputted thereto and remains active until a point in time when the second control signal STP is inputted thereto.

The pulse sensing unit 23 may include a strobe signal generating unit 231 and a counter 232.

The strobe signal generating unit 231 may generate a strobe signal DQS including pulses which are periodically generated in response to the section signal OSCEN.

The counter 232 may be driven in response to the section signal OSCEN and may generate first to third count signals CNT<1:3> by counting pulses of the strobe signal DQS.

That is, the pulse sensing unit 23 may generate the first to third count signals CNT<1:3> by counting the strobe signal DQS, the pulses of which are periodically generated in response to the section signal OSCEN.

The pulse signal generating unit 24 may generate a pulse signal TRIGP that includes pulses generated in response to the second control signal STP.

The update signal generating unit 25 may store the first to third count signals CNT<1:3> at a first point in time in response to the pulse signal TRIGP. The update signal generating unit 25 may generate an update signal UF that has an active state when a combination of the stored first to third count signals CNT<1:3> is different from a combination of the first to third count signals CNT<1:3> stored at a second point in time. The first and second points in time will be described in detail later.

The register 26 may generate the first to $N^{th}$ mode set signals MROP<1:N>, may store the first to third count signals CNT<1:3> therein in response to the update signal UF, may output the update signal UF as the external update signal EUF, and may output the first to third count signals CNT<1:3> as the first to third external count signals ECNT<1:3>. The register 26 may be set as a mode register set (hereinafter referred to as "MRS") that stores information for defining specific functions of the semiconductor device.

That is, the semiconductor device 20 may generate the first to third count signals CNT<1:3> by counting the pulses of the strobe signal DQS during a period when the section signal OSCEN, which is generated in response to the first control signal STR having pulses that are periodically generated, is in an active state (e.g., a logic "high" level). The semiconductor device 20 may also generate the external update signal EUF and the first to third external count signals ECNT<1:3> when the combination of the first to third count signals CNT<1:3> is changed.

Figure 2:
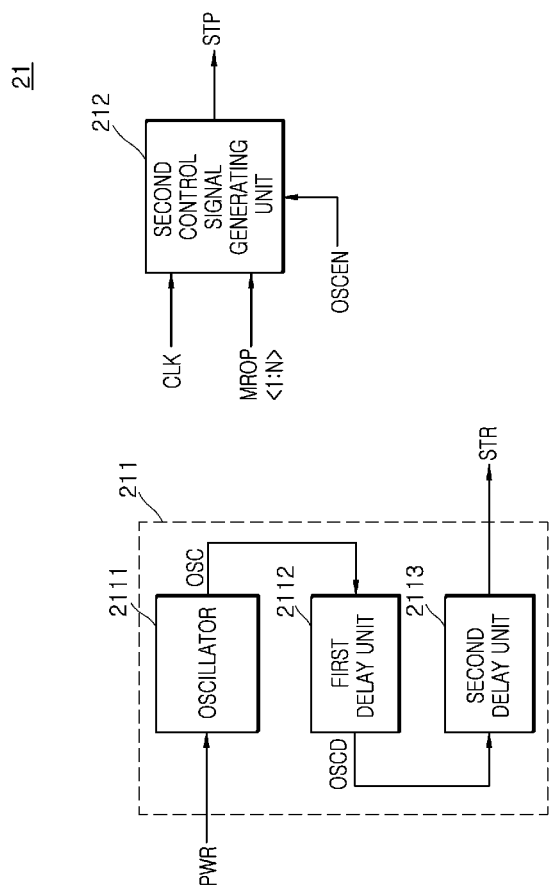
FIG. 2 is a block diagram illustrating a configuration of a control signal generating unit included in the semiconductor system of FIG. 1.

Referring to FIG. 2, the control signal generating unit 21 may include first and second control signal generating units 211 and 212. The first control signal generating unit 211 may include an oscillator 2111, a first delay unit 2112, and a second delay unit 2113.

The oscillator 2111 may generate a cycle signal OSC including pulses which are periodically generated in response to a power-up signal PWR that becomes active at least after the power-up period. The power-up period means a duration during which a level of a power supply voltage used in the semiconductor device 20 increases up to a predetermined level according to a level of an external voltage. In addition, the power-up signal PWR may be set to a signal which becomes active at least after the power-up period.

The first delay unit 2112 may generate a delay signal OSCD by delaying a point in time, when the pulses of the cycle signal OSC are generated, by a predetermined delay time.

The second delay unit 2113 may generate the first control signal STR by delaying a point in time, when the pulses of the delay signal OSCD are generated, by a predetermined delay time.

That is, the first control signal generating unit 211 may generate the first control signal STR including pulses which are periodically generated at least after the power-up period. Although FIG. 2 illustrates an example in which the first control signal generating unit 211 includes the first delay unit 2112 and the second delay unit 2113, the present disclosure is not limited thereto. According to embodiments, the number of delay units for adjusting points of time when the pulses of the first control signal STR may be set to be different.

The second control signal generating unit 212 may generate the second control signal STP which has an active state when the pulses of the clock signal CLK are generated by a predetermined number of times in response to the section signal OSCEN. The predetermined number of times may be set according to the combination of the first to $N^{th}$ mode set signals MROP<1:N>. That is, the second control signal generating unit 212 may generate the second control signal STP including pulses. The points in time, at which the pulses of the second control signal STP are generated, may be adjusted according to the combination of the first to $N^{th}$ mode set signals MROP<1:N>.

Figure 3:
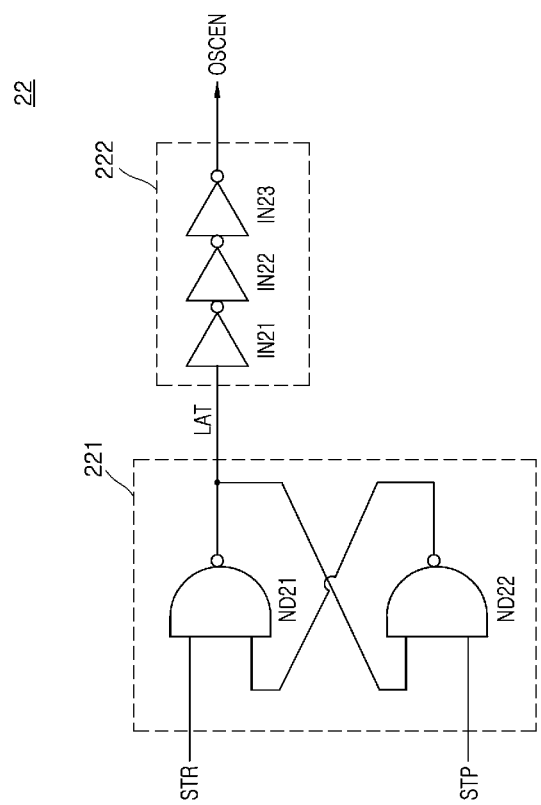
FIG. 3 is a logic circuit diagram illustrating a configuration of a section signal generating unit included in the semiconductor system of FIG. 1.

Referring to FIG. 3, the section signal generating unit 22 may include a latch signal generating unit 221 and a buffer unit 222.

The latch signal generating unit 221 may include a NAND gate ND21 and a NAND gate ND22. The NAND gate ND21 may execute a NAND operation on the first control signal STR and an output signal of a NAND gate ND22 to generate a latch signal LAT, and the NAND gate ND22 may execute a NAND operation on the latch signal LAT and the second control signal STP. The latch signal generating unit 221 may include the NAND gates ND21 and ND22 forming a general RS latch circuit.

That is, the latch signal generating unit 221 may generate the latch signal LAT which becomes active from a point in time when the first control signal STR is inputted thereto and remains active until a point in time when the second control signal STP is inputted thereto.

The buffer unit 222 may include inverters IV21, IV22, and IV23 which are coupled in series to each other and may generate the section signal OSCEN by inverting the latch signal LAT.

Figure 4:
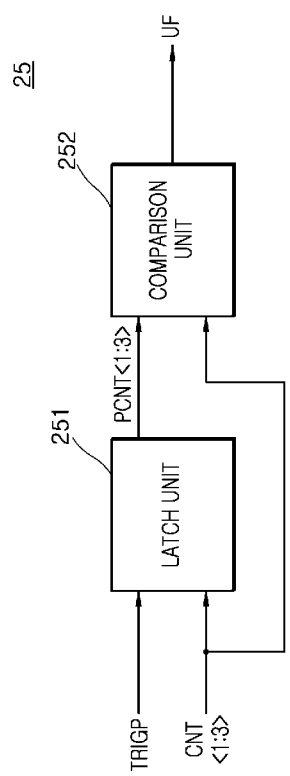
FIG. 4 is a block diagram illustrating a configuration of an update signal generating unit included in the semiconductor system of FIG. 1.

Referring to FIG. 4, the update signal generating unit 25 may include a latch unit 251 and a comparison unit 252.

The latch unit 251 may store the first to third count signals CNT<1:3> if no pulse of the pulse signal TRIGP is inputted thereto. The latch unit 251 may output the stored first to third count signals CNT<1:3> as first to third pre-count signals PCNT<1:3> if the pulses of the pulse signal TRIGP are inputted thereto.

The comparison unit 252 may generate the update signal UF which has an active state when a combination of the first to third pre-count signals PCNT<1:3> is different from a combination of the first to third count signals CNT<1:3>.

That is, the update signal generating unit 25 may store the first to third count signals CNT<1:3> in the latch unit 251 in response to the pulse signal TRIGP provided at a first point in time. The update signal generating unit 25 may generate the update signal UF that has an active state when a combination of the first to third count signals CNT<1:3>, which have been stored in the latch unit 251, is different from a combination of the first to third count signals CNT<1:3> provided at a second point in time. The first point in time means a point in time when no pulse of the pulse signal TRIGP is generated, and the second point in time means a point in time when a pulse of the pulse signal TRIGP is generated. In addition, the first point in time may be set to precede the second point in time.

Figure 5:
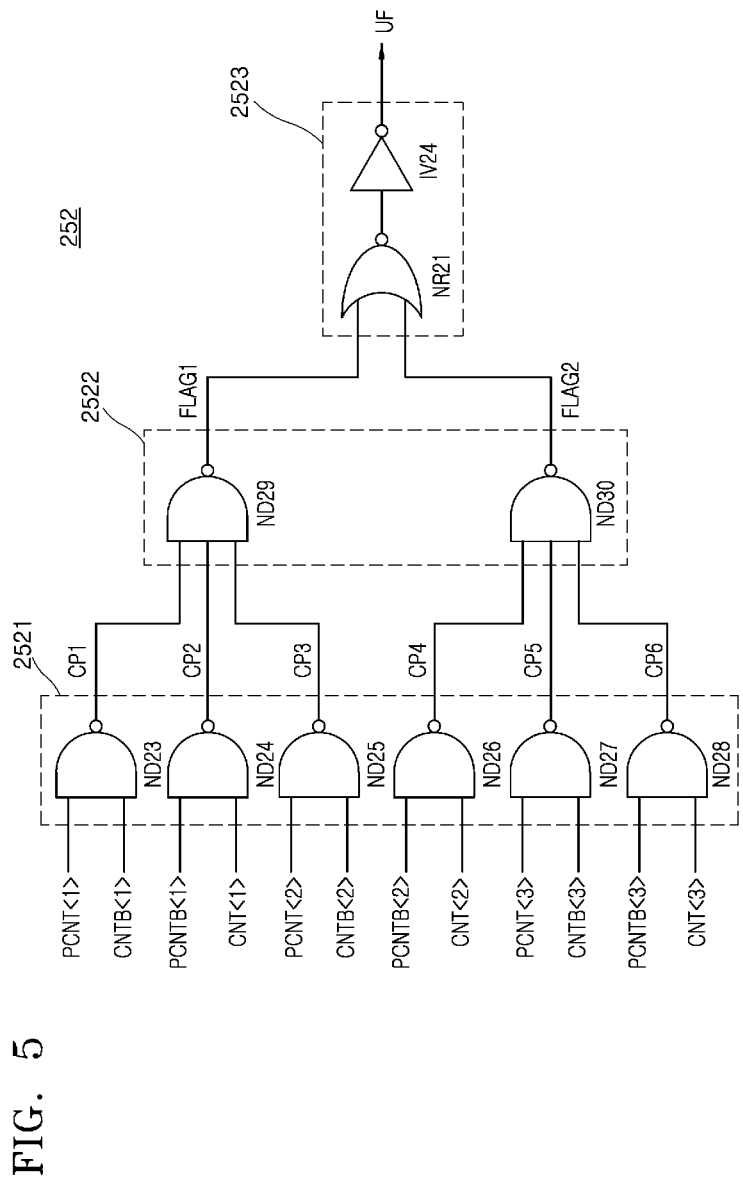
FIG. 5 is a logic circuit diagram illustrating a configuration of a comparison unit included in the update signal generating unit of FIG. 4.

Referring to FIG. 5, the comparison unit 252 may include a first logic unit 2521, a second logic unit 2522, and a third logic unit 2523.

The first logic unit 2521 may include a NAND gate ND23 that executes a NAND operation on a first pre-count signal PCNT<1> and a first inverted count signal CNTB<1> to generate a first comparison signal CP1, a NAND gate ND24 that executes a NAND operation on a first inverted pre-count signal PCNTB<1> and the first count signal CNT<1> to generate a second comparison signal CP2, a NAND gate ND25 that executes a NAND operation on a second pre-count signal PCNT<2> and a second inverted count signal CNTB<2> to generate a third comparison signal CP3, a NAND gate ND26 that executes a NAND operation on a second inverted pre-count signal PCNTB<2> and the second count signal CNT<2> to generate a fourth comparison signal CP4, a NAND gate ND27 that executes a NAND operation on a third pre-count signal PCNT<3> and a third inverted count signal CNTB<3> to generate a fifth comparison signal CP5, and a NAND gate ND28 that executes a NAND operation on a third inverted pre-count signal PCNTB<3> and the third count signal CNT<3> to generate a sixth comparison signal CP6. The first to third inverted pre-count signals PCNTB<1:3> may be complementary signals of the first to third pre-count signals PCNT<1:3>, respectively. The first to third inverted count signals CNTB<1:3> may be complementary signals of the first to third count signals CNT<1:3>, respectively.

That is, the first logic unit 2521 may generate the first to sixth comparison signals CP<1:6>, at least one of which has a logic "low" level, if a combination of the first to third pre-count signals PCNT<1:3> is different from a combination of the first to third count signals CNT<1:3>.

The second logic unit 2522 may include a NAND gate ND29 and a NAND gate ND30. The NAND gate ND29 may executes a NAND operation on the first to third comparison signals CP<1:3> to generate a first flag signal FLAG1, and the NAND gate ND30 may executes a NAND operation on the fourth to sixth comparison signals CP<4:6> to generate a second flag signal FLAG2.

That is, the second logic unit 2522 may generate the first flag signal FLAG1 having a logic "high" level if at least one of the first to third comparison signals CP<1:3> has a logic "low" level. The second logic unit 2522 may also generate the second flag signal FLAG2 having a logic "high" level if at least one of the fourth to sixth comparison signals CP<4:6> has a logic "low" level.

The third logic unit 2523 may include a NOR gate NR21 and an inverter IV24. The third logic unit 2523 may execute an OR operation on the first flag signal FLAG1 and the second flag signal FLAG2 to generate the update signal UF.

That is, the third logic unit 2523 may generate the update signal UF which has an active state (e.g., a logic "high" level) if at least one of the first flag signal FLAG1 and the second flag signal FLAG2 has a logic "high" level.

Figure 6:
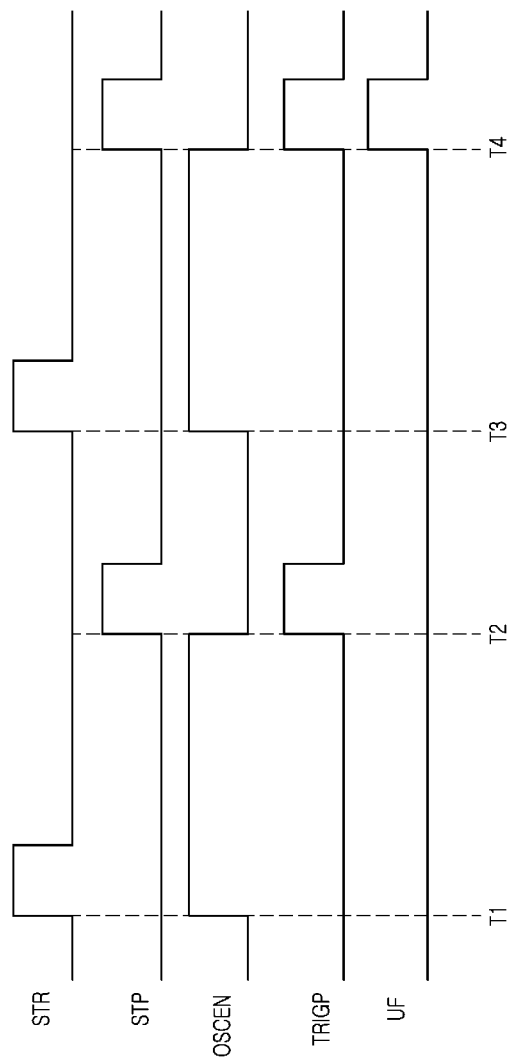
FIG. 6 is a timing diagram illustrating an operation of the semiconductor system according to an embodiment.

An operation of the semiconductor system having the aforementioned configuration will be described hereinafter with reference to FIG. 6 in conjunction with an example in which a cycle time of the first control signal STR including pulses is set to have 512 microseconds and six pulses of the strobe signal DQS and seven pulses of the strobe signal DQS are respectively created during first and second periods when the section signal OSCEN is in an active state.

First, the controller 10 may generate the clock signal CLK, but may not update the first to third external count signals ECNT<1:3> because the external update signal EUF is not active.

At a point in time "T1," after the power-up period, the first control signal STR being generated by the control signal generating unit 21 may have a rising edge. Here, the first control signal STR may have a pulse wave whose duty cycle is less than 50%.

The section signal generating unit 22 may generate the section signal OSCEN having a logic "high" level in response to the pulse of the first control signal STR. The section signal OSCEN may have a rising edge at the point in time "T1."

The pulse sensing unit 23 may generate the strobe signal DQS including pulses that are periodically generated in response to the section signal OSCEN having a logic "high" level and may generate the first to third count signals CNT<1:3> by counting the pulses of the strobe signal DQS.

The pulse signal generating unit 24 may receive the second control signal STP having a logic "low" level to generate the pulse signal TRIGP having a logic "low" level.

The update signal generating unit 25 may receive the pulse signal TRIGP having a logic "low" level to store the first to third count signals CNT<1:3>.

At a point in time "T2," the second control signal STP being generated by the control signal generating unit 21 may have a rising edge. Here, the second control signal STP may have a pulse wave whose duty cycle is less than 50%. The point in time when the second control signal STP has the rising edge may be adjusted by the first to $N^{th}$ mode set signals MROP<1:N>.

The section signal generating unit 22 may generate the section signal OSCEN having a logic "low" level in response to the pulse of the second control signal STP. For instance, the section signal OSCEN being generated by the section signal generating unit 22 may transition to a logic "low" level in response to the rising edge of the second control signal STP.

The pulse sensing unit 23 may not generate the strobe signal DQS when the section signal OSCEN has a logic "low" level.

At this time, the first to third count signals CNT<1:3> may be generated so that each of the first and second count signals CNT<1:2> has a logic "high" level and the third count signal CNT<3> has a logic "low" level. This is because six pulses of the strobe signal DQS are created during a first period T1-T2 when the section signal OSCEN is at a logic "high" level.

The pulse signal generating unit 24 may receive the second control signal STP having a logic "high" level to generate the pulse signal TRIGP having a logic "high" level.

The update signal generating unit 25 may receive the pulse signal TRIGP having a logic "high" level and may compare the first to third count signals CNT<1:3>, which have been stored in the latch unit 251, with the first to third count signals CNT<1:3> to generate the update signal UF having a logic "low" level.

At a point in time "T3," the first control signal STR being generated by the control signal generating unit 21 may have a rising edge. In an embodiment, a time interval between the point in time "T1" and the point in time "T2" may be 512 microseconds. Here, the first control signal STR may have a pulse wave whose duty cycle is less than 50%.

The section signal generating unit 22 may generate the section signal OSCEN having a logic "high" level in response to the pulse of the first control signal STR. For instance, the section signal OSCEN being generated by the section signal generating unit 22 may transition to a logic "low" level in response to the rising edge of the second control signal STP.

The pulse sensing unit 23 may generate the strobe signal DQS including pulses that are periodically generated in response to the section signal OSCEN having a logic "high" level and may generate the first to third count signals CNT<1:3> by counting the pulses of the strobe signal DQS.

The pulse signal generating unit 24 may receive the second control signal STP having a logic "low" level to generate the pulse signal TRIGP having a logic "low" level.

The update signal generating unit 25 may receive the pulse signal TRIGP having a logic "low" level to store the first to third count signals CNT<1:3>.

At a point in time "T4," the second control signal STP being generated by the control signal generating unit 21 may have a rising edge. Here, the second control signal STP may have a pulse wave whose duty cycle is less than 50%. The point in time when the second control signal STP has the rising edge may be adjusted by the first to $N^{th}$ mode set signals MROP<1:N>.

The section signal generating unit 22 may generate the section signal OSCEN having a logic "low" level in response to a pulse of the second control signal STP. For instance, the section signal OSCEN being generated by the section signal generating unit 22 may transition to a logic "low" level in response to the rising edge of the second control signal STP.

The pulse sensing unit 23 may not generate the strobe signal DQS when the section signal OSCEN has a logic "low" level.

At this time, the first to third count signals CNT<1:3> may be generated so that all of the first to third count signals CNT<1:3> have logic "high" levels. This is because seven pulses of the strobe signal DQS are created during a second period T3-T4 when the section signal OSCEN is at a logic "high" level.

The pulse signal generating unit 24 may receive the second control signal STP having a logic "high" level to generate the pulse signal TRIGP having a logic "high" level.

The update signal generating unit 25 may receive the pulse signal TRIGP having a logic "high" level to generate the update signal UF having a logic "high" level because the combination of the first to third count signals CNT<1:3>, which have been stored in the latch unit 251 at the point of time "T2," is different from the combination of the first to third count signals CNT<1:3> generated at the point in time "T3."

At this time, the register 26 may receive the update signal UF having a logic "high" level, store the first to third count signals CNT<1:3> therein, output the update signal UF as the external update signal EUF, and output the first to third count signals CNT<1:3> as the first to third external count signals ECNT<1:3>.

The controller 10 may update the first to third external count signals ECNT<1:3> in response to the external update signal EUF.

The semiconductor system having the aforementioned configuration may update information regarding an amount of delay of the strobe signal DQS which may occur due to PVT variation.

Figure 7:
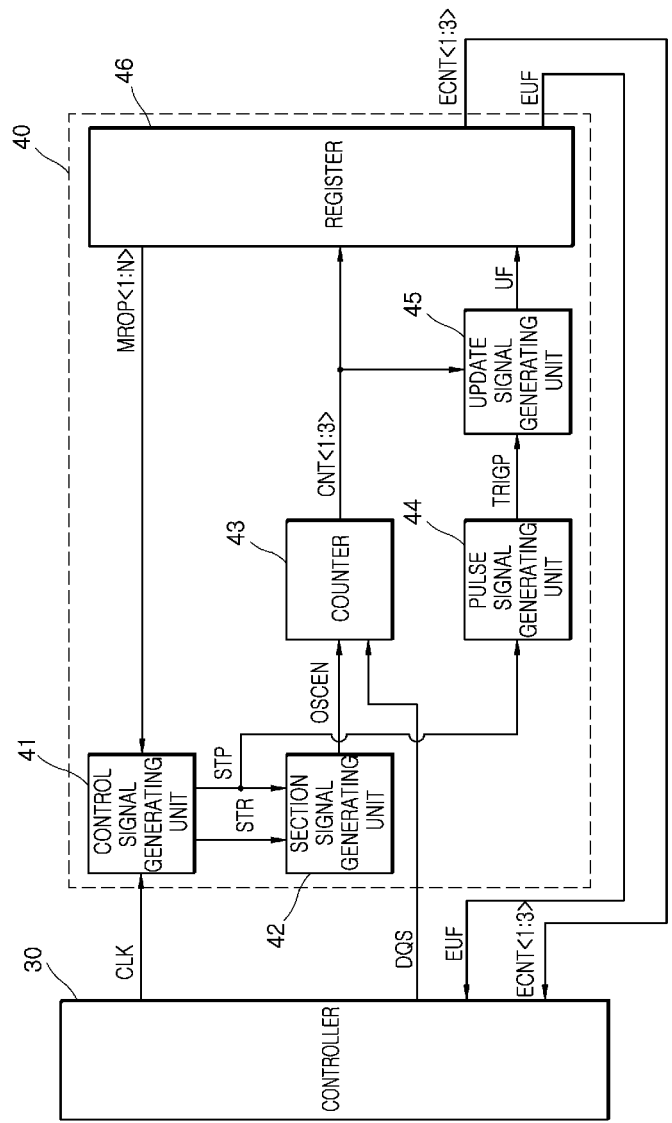
FIG. 7 is a block diagram illustrating a configuration of a semiconductor system according to an embodiment.

FIG. 7 is a block diagram illustrating a configuration of a semiconductor system according to an embodiment.

Referring to FIG. 7, the semiconductor system may include a controller 30 and a semiconductor device 40. The semiconductor device 40 may include a control signal generating unit 41, a section signal generating unit 42, a counter 43, a pulse signal generating unit 44, an update signal generating unit 45, and a register 46.

The controller 30 may generate a clock signal CLK and a strobe signal DQS including pulses which are periodically generated and may update first to third external count signals ECNT<1:3> in response to an external update signal EUF. In addition, the controller 30 may adjust, according to the first to third external count signals ECNT<1:3>, points in time when the pulses of the strobe signal DQS are generated.

The control signal generating unit 41 may generate a first control signal STR including pulses which are periodically generated after a power-up period and may generate a second control signal STP including pulses. The points in time, when the pulses of the second control signal STP are generated, may be adjusted according to a combination of first to $N^{th}$ mode set signals MROP<1:N>.

The section signal generating unit 42 may generate a section signal OSCEN which becomes active from a point in time when the first control signal STR is inputted thereto and remains active until a point in time when the second control signal STP is inputted thereto.

The counter 43 may generate first to third count signals CNT<1:3> by counting the pulses of the strobe signal DQS in response to the section signal OSCEN.

The pulse signal generating unit 44 may generate a pulse signal TRIGP including pulses which are generated in response to the second control signal STP.

The update signal generating unit 45 may store the first to third count signals CNT<1:3> at a first point in time in response to the pulse signal TRIGP and may generate an update signal UF that has an active state when a combination of the stored first to third count signals CNT<1:3> is different from a combination of the first to third count signals CNT<1:3> stored at a second point in time. The first point in time means a point in time when no pulse of the pulse signal TRIGP is generated, and the second point in time means a point in time when a pulse of the pulse signal TRIGP is generated. In addition, the first point in time may be set to precede the second point in time.

The register 46 may generate the first to $N^{th}$ mode set signals MROP<1:N>, may store the first to third count signals CNT<1:3> therein in response to the update signal UF, may output the update signal UF as the external update signal EUF, and may output the first to third count signals CNT<1:3> as the first to third external count signals ECNT<1:3>. The register 46 may be set as the MRS that stores information for defining specific functions of the semiconductor device.

That is, the semiconductor device 40 may generate the first to third count signals CNT<1:3> by counting the pulses of the strobe signal DQS during a period when the section signal OSCEN, which is generated in response to the first control signal STR including pulses that are periodically generated, is in is in an active state (e.g., a logic "high" level). The semiconductor device 40 may also generate the external update signal EUF and the first to third external count signals ECNT<1:3> when the combination of the first to third count signals CNT<1:3> is changed.

The semiconductor device 40 illustrated in FIG. 7 may include one or more of the same circuitry as the semiconductor device 20 illustrated in FIG. 1. That is, the control signal generating unit 41, the section signal generating unit 42, the counter 43, the pulse signal generating unit 44, the update signal generating unit 45, and the register 46 may have the same configurations as the control signal generating unit 21, the section signal generating unit 22, the counter 232, the pulse signal generating unit 24, the update signal generating unit 25, and the register 26 described with reference to FIGS. 1 to 5, respectively. Thus, detailed descriptions of the control signal generating unit 41, the section signal generating unit 42, the counter 43, the pulse signal generating unit 44, the update signal generating unit 45, and the register 46 will be omitted hereinafter.

The semiconductor system described above may update information regarding an amount of delay of the strobe signal DQS which may occur due to PVT variation and may compensate for the amount of delay of the strobe signal DQS.

What is claimed is:

1. A semiconductor system comprising:
   a controller suitable for generating a clock signal and updating external count signals in response to an external update signal; and
   a semiconductor device suitable for:
      generating count signals by counting pulses of a strobe signal during a period when a section signal is in an active state, the section signal being generated in response to a first control signal including periodically generated pulses; and
      generating the external update signal and the external count signals if a combination of the count signals is changed.

2. The system of claim 1, wherein the period when the section signal is in an active state is adjusted according to a combination of mode set signals.

3. The system of claim 1, wherein the external count signals are generated from the count signals if an update signal is generated.

4. The system of claim 1, wherein the semiconductor device includes:
   a control signal generating unit suitable for generating the first control signal including pulses periodically generated after a power-up period and generating a second control signal including pulses, wherein the points in time, when the pulses of the second control signal are generated, are adjusted according to a combination of mode set signals;
   a section signal generating unit suitable for generating the section signal, the section signal becoming active from a point in time when the first control signal is inputted thereto and remaining active until a point in time when the second control signal is inputted thereto;
   a pulse sensing unit suitable for generating the count signals by counting the pulses of the strobe signal in response to the section signal, the pulses of the strobe signal being periodically generated in response to the section signal;
   an update signal generating unit suitable for storing the count signals at a first point in time in response to a pulse signal and generating an update signal having an active state when a combination of the stored count signals is different from a combination of the count signals provided at a second point in time; and
   a register suitable for outputting the mode set signals, storing the count signals therein in response to the update signal, outputting the update signal as the external update signal, and outputting the count signals as the external count signals.

5. The system of claim 4, wherein the control signal generating unit includes:
   a first control signal generating unit suitable for generating the first control signal including pulses periodically generated after the power-up period; and
   a second control signal generating unit suitable for generating the second control signal having an active state when pulses of the clock signal are generated by a predetermined number of times in response to the section signal,
   wherein the predetermined number of times is set according to a combination of the mode set signals.

6. The system of claim 5, wherein the first control signal generating unit includes:
   an oscillator suitable for generating a cycle signal including pulses periodically generated in response to a power-up signal becoming active at least after the power-up period;
   a first delay unit suitable for generating a delay signal by delaying, by a first predetermined delay time, points in time when the pulses of the cycle signal are generated; and
   a second delay unit suitable for generating the first control signal by delaying, by a second predetermined delay time, points in time when pulses of the delay signal are generated.

7. The system of claim 4, wherein the section signal generating unit includes:
   a latch signal generating unit suitable for generating a latch signal becoming active in response to the first control signal and becoming inactive in response to the second control signal; and
   a buffer unit suitable for inverting the latch signal to generate the section signal.

8. The system of claim 4, wherein the pulse sensing unit includes:
   a strobe signal generating unit suitable for generating the strobe signal including pulses periodically generated in response to the section signal; and
   a counter suitable for counting the pulses of the strobe signal to generate the count signals.

9. The system of claim 4, wherein the update signal generating unit includes:
   a latch unit suitable for storing the count signals in response to the pulse signal to generate pre-count signals; and
   a comparison unit suitable for comparing the pre-count signals with the count signals to generate the update signal.

10. The system of claim 4, further comprising a pulse signal generating unit suitable for generating the pulse signal including pulses generated in response to the second control signal.

11. A semiconductor system comprising:
    a controller suitable for generating a clock signal and a strobe signal, updating external count signals in response to an external update signal, and adjusting, in response to the external count signals, points in time when pulses of the strobe signal are generated; and
    a semiconductor device suitable for:
       generating count signals by counting pulses of the strobe signal during a period when a section signal is in an active state, the section signal being generated in response to a first control signal including periodically generated pulses; and
       generating the external update signal and the external count signals if a combination of the count signals is changed.

12. The system of claim 11, wherein the period when the section signal is in an active state is adjusted according to a combination of mode set signals.

13. The system of claim 11, wherein the external count signals are generated from the count signals if an update signal is generated.

14. The system of claim 11, wherein the semiconductor device includes:
- a control signal generating unit suitable for generating the first control signal including pulses periodically generated after a power-up period and generating a second control signal including pulses, wherein the points in time, when the pulses of the second control signal are generated, are adjusted according to a combination of mode set signals;
- a section signal generating unit suitable for generating the section signal, the section signal becoming active from a point in time when the first control signal is inputted thereto and remaining active until a point in time when the second control signal is inputted thereto;
- a counter suitable for counting the pulses of the strobe signal in response to the section signal to generate the count signals;
- an update signal generating unit suitable for storing the count signals at a first point in time in response to a pulse signal and generating an update signal having an active state when a combination of the stored count signals is different from a combination of the count signals provided at a second point in time; and
- a register suitable for outputting the mode set signals, storing the count signals therein in response to the update signal, outputting the update signal as the external update signal, and outputting the count signals as the external count signals.

15. The system of claim 14, wherein the control signal generating unit includes:
- a first control signal generating unit suitable for generating the first control signal including pulses periodically generated after the power-up period; and
- a second control signal generating unit suitable for generating the second control signal having an active state when pulses of the clock signal are generated by a predetermined number of times in response to the section signal, wherein the predetermined number of times is set according to a combination of the mode set signals.

16. The system of claim 15, wherein the first control signal generating unit includes:
- an oscillator suitable for generating a cycle signal including pulses periodically generated in response to a power-up signal becoming active at least after the power-up period;
- a first delay unit suitable for generating a delay signal by delaying, by a first predetermined delay time, points in time when the pulses of the cycle signal are generated; and
- a second delay unit suitable for generating the first control signal by delaying, by a second predetermined delay time, points in time when pulses of the delay signal are generated.

17. The system of claim 14, wherein the section signal generating unit includes:
- a latch signal generating unit suitable for generating a latch signal becoming active in response to the first control signal and becoming inactive in response to the second control signal; and
- a buffer unit suitable for inverting the latch signal to generate the section signal.

18. The system of claim 14, wherein the update signal generating unit includes:
- a latch unit suitable for storing the count signals in response to the pulse signal to generate pre-count signals; and
- a comparison unit suitable for comparing the pre-count signals with the count signals to generate the update signal.

19. The system of claim 14, further comprising a pulse signal generating unit suitable for generating the pulse signal including pulses generated in response to the second control signal.

* * * * *